(12) United States Patent
Senda et al.

(10) Patent No.: US 12,046,469 B2
(45) Date of Patent: Jul. 23, 2024

(54) MANUFACTURING METHOD FOR SEMICONDUCTOR SILICON WAFER

(71) Applicant: GLOBALWAFERS JAPAN CO., LTD., Niigata (JP)

(72) Inventors: Takeshi Senda, Niigata (JP); Shingo Narimatsu, Niigata (JP)

(73) Assignee: GLOBALWAFERS JAPAN CO., LTD., Niigata (JP)

( * ) Notice: Subject to any disclaimer, the term of this patent is extended or adjusted under 35 U.S.C. 154(b) by 175 days.

(21) Appl. No.: 17/797,874

(22) PCT Filed: Feb. 16, 2021

(86) PCT No.: PCT/JP2021/005674
§ 371 (c)(1),
(2) Date: Aug. 5, 2022

(87) PCT Pub. No.: WO2021/166895
PCT Pub. Date: Aug. 26, 2021

(65) Prior Publication Data
US 2023/0055929 A1    Feb. 23, 2023

(30) Foreign Application Priority Data
Feb. 19, 2020    (JP) ................. 2020-026332

(51) Int. Cl.
C30B 25/16    (2006.01)
C23C 16/24    (2006.01)
(Continued)

(52) U.S. Cl.
CPC ........ H01L 21/02381 (2013.01); C23C 16/24 (2013.01); C30B 25/16 (2013.01);
(Continued)

(58) Field of Classification Search
CPC ......... C30B 15/04; C30B 25/16; C30B 25/20; C30B 29/06; C30B 33/02; C23C 16/24;
(Continued)

(56) References Cited

U.S. PATENT DOCUMENTS 5,744,401 A * 4/1998 Shirai ................ H01L 21/3003
                                                    438/693
6,544,490 B1 * 4/2003 Takeno ............... H01L 21/3225
                                                    257/E21.321
(Continued)

FOREIGN PATENT DOCUMENTS

JP    2013-048137 A    3/2013
JP    2013-163597 A    8/2013
(Continued)

OTHER PUBLICATIONS

Senda et al., "Atomic Structures of Grown-in Si—P Precipitates in Red-Phosphorus Heavily Doped CZ-Si Crystals", (TuP-16), 29th International Conference on Defects in Semiconductors, (Aug. 1, 2017),(3 pages).
(Continued)

Primary Examiner — Robert M Kunemund
(74) Attorney, Agent, or Firm — BUCHANAN, INGERSOLL & ROONEY PC

(57) ABSTRACT

A semiconductor silicon wafer manufacturing method is provided, where P aggregate defects and SF in an epitaxial layer can be suppressed. A silicon wafer substrate cut from a monocrystal ingot is doped with phosphorus and has a resistivity of 1.05 mΩ·cm or less and a concentration of solid-solution oxygen of $0.9 \times 10^{18}$ atoms/cm$^3$. The method includes steps of mirror-polishing substrates and heat treatment, where after the mirror-polishing step, the substrate is kept at a temperature from 700° C. to 850° for 30 to 120 minutes, then after the temperature rise, kept at a temperature from 1100° C. to 1250° for 30 to 120 minutes, and after
(Continued)

cooling, kept at a temperature from 700° C. to 450° C. for less than 10 minutes as an experience time. The heat treatment step is performed in a mixture gas of hydrogen and argon. The method includes an epitaxial layer deposition step to a thickness of 1.3 µm to 10.0 µm.

7 Claims, 6 Drawing Sheets

(51) Int. Cl.
  *C30B 25/20* (2006.01)
  *C30B 29/06* (2006.01)
  *C30B 33/02* (2006.01)
  *H01L 21/02* (2006.01)
  *C30B 15/04* (2006.01)

(52) U.S. Cl.
  CPC .............. *C30B 25/20* (2013.01); *C30B 29/06* (2013.01); *C30B 33/02* (2013.01); *H01L 21/02008* (2013.01); *H01L 21/02433* (2013.01); *H01L 21/02532* (2013.01); *H01L 21/0262* (2013.01); *H01L 21/02658* (2013.01); *C30B 15/04* (2013.01)

(58) Field of Classification Search
  CPC ......... H01L 21/02381; H01L 21/02008; H01L 21/02433; H01L 21/02532; H01L 21/0262; H01L 21/02658
  See application file for complete search history.

(56) References Cited

U.S. PATENT DOCUMENTS

| | | | |
|---|---|---|---|
| 7,189,293 B2* | 3/2007 | Kobayashi | H01L 21/3225 257/E21.321 |
| 9,425,264 B2 | 8/2016 | Kawashima et al. | |
| 9,755,022 B2 | 9/2017 | Kawashima et al. | |
| 10,100,429 B2 | 10/2018 | Narushima et al. | |
| 10,253,429 B2 | 4/2019 | Nonaka et al. | |
| 2004/0192071 A1* | 9/2004 | Kobayashi | H01L 21/324 257/E21.321 |
| 2006/0086313 A1* | 4/2006 | Sakurada | C30B 15/203 117/89 |
| 2011/0052923 A1* | 3/2011 | Umeno | C30B 15/00 252/500 |
| 2016/0247694 A1* | 8/2016 | Fujise | H01L 21/3225 |
| 2016/0377554 A1* | 12/2016 | Fujise | H01L 21/3225 250/339.01 |

FOREIGN PATENT DOCUMENTS

| | | |
|---|---|---|
| JP | 5845143 B2 | 11/2015 |
| JP | 5892232 B1 | 3/2016 |
| JP | 6477210 B2 | 2/2019 |
| JP | 2019142733 A | 8/2019 |
| JP | 2019186449 A | 10/2019 |

OTHER PUBLICATIONS

Senda et al., "Atomic Structures of Grown-in Si—P Precipitates in Red-Phosphorus Heavily Doped CZ-Si Crystals", (7p-PB6-5), The 78th JSAP Autumn Meeting, Sep. 5-8, 2017), with an English abstract. (3 pages).

Office Action (The First Office Action) issued Mar. 19, 2023, by the State Intellectual Property Office of People's Republic of China in corresponding Chinese Patent Application No. 202180015661.X. (6 pages).

International Search Report (PCT/ISA/210) with translation and Written Opinion (PCT/ISA/237) mailed on Apr. 20, 2021, by the Japanese Patent Office as the International Searching Authority for International Application No. PCT/JP2021/005674. (8 pages).

* cited by examiner

MANUFACTURING METHOD FOR SEMICONDUCTOR SILICON WAFER

TECHNICAL FIELD

The present invention relates to a method for manufacturing semiconductor silicon wafers, specifically relates to a method for manufacturing a semiconductor silicon wafer composed of a silicon wafer substrate and a silicon monocrystalline epitaxial layer formed thereon, where the silicon wafer substrate is doped with phosphorus P and has a concentration of solid-solution oxygen adjusted to be $0.9 \times 10^{18}$ atoms/cm$^3$ and a resistivity adjusted to be 1.05 mΩ·cm or less.

BACKGROUND ART

The substrate resistivity of the most advanced epitaxial wafer for power metal oxide semiconductor field-effect transistor (MOS-FET) devices is 1.00 mΩ·cm or less. To further reduce the resistivity of the substrate requires an increase in dopant concentration. Therefore, the n-type dopant species has shifted from arsenic and antimony to phosphorus (P), which has relatively low volatility, and its concentration is approximately $1 \times 10^{20}$ atoms/cc.

As recited in patent literature PTL1 to PTL3, growing an epitaxial layer with the increased dopant concentration causes to generate stacking faults (hereinafter also referred to as SF) in the epitaxial layer. In particular, SFs are apt to occur in the case of substrates having a resistivity of 1.1 mΩ·cm or less.

It is reported in PTL 1 to PTL 3 that the reason is speculated that the crystal defects originating from the SF are defects due to clusters of phosphorus (P) and oxygen (O). Further, PTLs also report the inhibition techniques of crystal defects in the processes of crystal growth, heat treatment thereafter, and epitaxial growth.

Specifically, clusters of phosphorus and oxygen, or micro precipitates, are formed in a silicon wafer heavily doped with phosphorus. Then, to remove the natural oxide layer on the surface of the silicon wafer, by performing heat treatment in a hydrogen gas atmosphere (hereinafter referred to as hydrogen baking processing), the clusters are selectively etched to become into fine pits, due to the etching action of hydrogen and the difference in etching speed between the outermost surface of the silicon wafer and the clusters. The PTLs report that it is speculated that when an epitaxial layer is grown on a silicon wafer in which the micro pits are formed, SF originating from the micro pits are generated in the epitaxial layer.

Patent Literature PTL 1 discloses a method for manufacturing an epitaxial silicon wafer including
- a step of forming a back-surface oxide film on the back surface of a silicon wafer cut out from a single crystal ingot manufactured by the CZ method,
- a step of removing the back-surface oxide film existing on the outer circumference of the silicon wafer,
- a step of argon annealing in which the silicon wafer after the removal of the back-surface oxide is heat-treated at a temperature of 1200° C. or higher and 1220° C. or lower in an argon atmosphere,
- a step of the hydrogen baking process in which the wafer after the argon annealing step is heat-treated for 30 seconds or more and 300 seconds or less at a temperature of 1050° C. or more and 1200° C. or less in a hydrogen atmosphere, and
- a step of growing an epitaxial layer on the surface of the silicon wafer after the hydrogen baking process.

The document PTL1 also recites that SF in the epitaxial layer can be inhibited by the above process steps.

PTL 2 recites, similar to PTL 1, a method for manufacturing an epitaxial silicon wafer and that the occurrence of SF in the epitaxial layer is inhibited. PTL3 recites a method for manufacturing a silicon single crystal including a step of forming a straight body having a length equal to 550 mm or less by pulling up a seed crystal after dipping into a silicon melt, to which red phosphorus is added such that the single crystal has a resistivity of 0.9 mΩ·cm or less, a step of forming a tail portion with a length of 100 mm or longer and 140 mm or shorter at the lower end of the straight body, and a step of separating the single crystal from the dopant-added melt in a state where the temperature of the upper end of the straight body is 590 degrees C. or higher. The PTL 3 recites that this method allows the obtainment of epitaxial silicon wafers that the generation of light point defects LPD originated from the SF is inhibited.

CITATION LIST

Patent Literature

PTL 1: JP5845143
PTL 2: JP6477210
PTL 3: JP5892232

SUMMARY OF INVENTION

Technical Problem

Unfortunately, even with the manufacturing methods for a single crystal and epitaxial silicon wafers recited in PTL 1 through PTL, 3, sufficient reduction effects of SF to meet the requirement cannot be obtained. It is difficult to inhibit the SF even by reducing clusters of phosphorus and oxygen (micro precipitates) with reduced solid oxygen concentration.

To solve the above problem, the present inventors have intensively studied the inhibition of SF in an epitaxial layer. As a result, they found that the cause of SF in the epitaxial layer is P-aggregation defects, that is, Si—P defects formed from phosphorus and silicon. Further, they found that P-aggregation defects (Si—P defects) have an internal extra Si plane (SF) therein (See NPL 1 and 2), and this becomes crystal strain in the substrate surface before deposition of the epitaxial layer and becomes SF propagating in the epitaxial layer (epi-layer) in the deposition of the epitaxial layer thereafter.

The Si—P defects, as shown in references NPL 1 and 2, are plate-like defects containing silicon and a few atomic percent of phosphorus. Phosphorus atoms reside not at the atomic site but interstitially, and surplus silicon (extrinsic SF) atoms are also contained.

The phosphorus concentration estimated from the resistivity around the defects is approximately 0.2 atom %, the phosphorus aggregates locally and there are crystal strains.

The references, Non-Patent Literature, NPL 1 and 2 are as follows:
NPL 1: "Atomic structures of grown-in Si—P defects in red-phosphorus heavily doped CZ Si crystals" (TuP-16), 29th International Conference on Defects in Semiconductors.

NPL 2: "Atomic structures of grown-in Si—P defects in red-phosphorus heavily doped CZ—Si crystals" [7p-PB6-5], The 78th JSAP Autumn Meeting, 2017.

The present inventors found that the growth of SF, or the size thereof, depends on a low-temperature experience time at the time of the pulling-up of the silicon single crystal. Namely, it is difficult to inhibit the SF originating from P-aggregation defects (Si—P defects) by the technique taught in PTL 1 through 3. They further found that optimization is necessary for all the processes including crystal growth, heat treatment, growth of epitaxial layers, and others. This leads them to complete the present invention.

The present invention aims at providing a manufacturing method for silicon wafers that inhibits the generation of P-aggregation defects (Si—P defects) and the occurrence of SF in the epitaxial layers.

Solution to Problems

A method for manufacturing a semiconductor silicon wafer composed of a silicon wafer substrate and a silicon monocrystalline epitaxial layer thereon, where the silicon wafer substrate is sliced from a monocrystalline silicon ingot doped with phosphorus which is grown by the Czochralski method at a pulling speed of 0.5 mm/min or more and 1.0 mm/min or less with the application of a magnetic field of 2000 G or more and 4000 G or less, and the silicon substrate has a resistivity of 1.05 mΩ·cm or less, a concentration of solid-solution oxygen of $0.9 \times 10^{18}$ atoms/cm$^3$, and Si—P defects that are substantially P aggregation defects generated by forcibly cooling the grown crystal with a water-cooler installed within the pulling-up furnace, includes a step of mirror-polishing a front surface of the silicon wafer substrate, a step of heat treatment of the silicon wafer substrate after mirror-polishing, in the heat treatment step, the substrate being kept at a constant temperature between 700° C. or higher and 850° C. or lower for 30 minutes or longer to 120 minutes or shorter, then after rising the temperature the silicon wafer substrate being kept at a temperature between 1100° C. or higher and 1250° C. or lower for 30 minutes or longer to 120 minutes or shorter, and then after, an experience time for the silicon wafer substrate to experience temperatures between 700° C. and 450° C. at a time of temperature cooling being less than 10 minutes, wherein in the series of the heat treatment, a furnace atmosphere is a mixed gas composed of hydrogen H2 and argon Ar, and after the heat treatment step, a step of depositing a silicon monocrystalline epitaxial layer to a thickness equal to 1.3 μm or more and 10.0 μm or less.

Thus, with the method for semiconductor silicon wafers according to the present invention, the generation of SF in the epitaxial layer can be inhibited because P-aggregation defects (Si—P defects) can be inhibited in the crystal growth and heat treatment process.

The silicon wafer substrate for the present invention is doped with phosphorus and is adjusted to have a resistivity of 1.05 mΩ·cm and a concentration of solid-solution oxygen of $0.9 \times 10^{18}$ atoms/cm$^3$.

In the manufacturing process of the substrate, the silicon ingot is pulled up at a pulling speed between 0.5 mm/min or faster and 1.0 mm/min or slower under the application of a magnetic field between 2000 G or stronger and 4000 G or weaker, and forcible cooling of the grown crystal with a water cooler installed inside the furnace allows for the manufacturing of the substrates in which the increases in size and density of P-aggregation defects (Si—P defects) are inhibited. This manufacturing condition aims at shortening the passing time of the temperature region between 600° C. and 700° C. because this temperature region is the one that accelerates the growth of Si—P defects in the crystal growth.

The substrate thus manufactured is kept at a constant temperature between 700° C. or higher and 850° C. or lower for 30 minutes or longer and 120 minutes or shorter. When thermally processed at a temperature of 700° C. or higher, impurities, moisture, and oxygen desorb from the silicon oxide layer formed on the backside of the wafers.

The surface of the silicon wafer substrate becomes apt to react when thermally processed at a temperature of 850° C. or higher. Therefore, when thermally processed at a temperature of 850° C. or higher, the surface roughness of the wafer deteriorates by the impurities desorbed from the silicon oxide layer.

In the present invention, the deterioration of surface roughness caused by the desorption of impurities from the silicon oxide film is inhibited by keeping the wafers at a temperature of 700° C. or higher and 850° C. or lower for a fixed time. Because the surface roughness increases at a treatment temperature of 850° C. or higher, the problem of deterioration of surface roughness is avoided by sufficiently densifying the silicon oxide film at a temperature of 700° C. or higher and 850° C. or lower and allowing the desorbed gas to evacuate from the furnace; thus, the problem of the roughening is avoided. The procedure causes the promotion of decomposition of phosphorus in the Si—P defects and diffusion and gives the effects of contraction and density reduction of Si—P defects. The keeping time at the above temperature range is 30 minutes or longer and 120 minutes or shorter.

The keeping time shorter than 30 minutes is not desirable because the densification of the silicon oxide film is not sufficient, and the holding time longer than 120 minutes is not desirable because the productivity decreases.

Further, after the silicon substrates are kept at a fixed temperature between 700° C. or higher and 850° C. or lower for 30 minutes or longer and 120 minutes or shorter, then the temperature is raised and the substrates are kept at a fixed temperature between 1100° C. or higher and 1250° C. or lower for 30 minutes or longer and 120 minutes or shorter.

Keeping the substrate at a temperature between 1100° C. or higher and 1250° C. or lower is for the purpose of relaxation of strains due to Si—P defects, and this relaxation of the strains inhibits the generation of SF during the deposition of an epitaxial layer.

Further, after that, the temperature of the substrates is lowered such that the duration is made less than 10 minutes in which the wafers experience a temperature range from 700° C. to 450° C. This short passing time of the temperature range from 700° C. to 450° C. allows for inhibiting the generation of P aggregation defects, Si—P defects.

A series of heat treatments to the substrates described above is performed under a furnace atmosphere of a mixed gas composed of $H_2$ and Ar gas. Since the silicon wafers are heat-treated in a mixed gas of hydrogen and argon, the annihilation of Si—P defects is desirably promoted.

After the heat treatments, a silicon monocrystalline epitaxial layer is formed with a thickness not less than 1.3 μm to not more than 10.0 μm. The thickness of the epitaxial layers is a typical value; that is, the silicon monocrystalline epitaxial layer of less than 1.3 μm cannot bear the electric voltage applied during the device process, and the layer with a thickness of more than 10.0 μm undesirably increases the cost.

As described above, in the present invention, by suppressing the P-aggregation defects, Si—P defects, in the processes of crystal growth and heat treatment, SF in the epitaxial layer can be inhibited.

It is desirable that the maximum side length of Si—P defects is less than 100 nm and the density of the defects is less than $1\times10^{12}/cm^3$. When the maximum side length is 100 nm or longer, Si—P defects become revealed as SF (Light point defect; LPD) after the epitaxial layer deposition process. Further, it is not desirable because when the density of Si—P defects is not less than $1\times10^{12}/cm^3$, numerous SF (LPD) remain, which affects the electric characteristics in the device processes.

It is desirable that the atmosphere in the furnace for heat treatments at a temperature range of 700° C. or higher to less than 850° C. is a diluted argon gas with hydrogen whose partial pressure is in a range of 50% to 80% and the atmosphere at a higher temperature of 850° C. or more is a diluted argon gas with hydrogen whose partial pressure is in a range of 0.01% to 20%. The reason why the atmosphere in the furnace for heat treatments at a temperature range of 700° C. or higher to less than 850° C. is a diluted argon gas with hydrogen whose partial pressure is in a range of 50% to 80% is to promote the densification of silicon oxide film by hydrogen and to inhibit the physical etching of silicon oxide film by hydrogen. Further, the reason why the atmosphere at a higher temperature of 850° C. or more is a diluted argon gas with hydrogen whose partial pressure is in a range of 0.01% to 20% is to promote the annihilation of Si—P defects and to inhibit the physical etching of silicon oxide film by hydrogen, similarly to the above.

To a substrate before a step of depositing an epitaxial layer, a surface cleaning step is performed, whereby it is desirable that surface silicon is removed to a depth of 50 nm or more to 150 nm or less by etching with a mixed gas of hydrogen ($H_2$), hydrogen chloride (HCl), and Si—H—Cl gas.

Thus, by performing the cleaning step, SF after epitaxial layer growth can be further reduced, where defects removal by hydrogen chloride HCl is effective and defects removal by mixed gas of hydrogen $H_2$ and hydrogen chloride HCl is desirable. Since the defect removal is performed with a mixed gas of hydrogen $H_2$, hydrogen chloride HCl, and Si—H—Cl, in the beginning, the partial pressure of hydrogen chloride HCl is kept at a certain value in the mixed gas of hydrogen $H_2$ and hydrogen chloride HCl. Then, by reducing the partial pressure of hydrogen chloride HCl, the surface shape of the substrate is reconstructed in hydrogen baking, thereafter, Si—H—Cl gas may be introduced while lowering the hydrogen chloride (HCl) partial pressure.

Because the residual depth of the defects is approximately 100 nm, the etching depth of surface silicon is appropriate to be in a range of 50 nm or more and 150 nm or less if productivity is also taken into account.

The silicon epitaxial layer is preferably deposited at a deposition temperature of 1100° C. or higher and 1150° C. or lower at a growth rate of 3.5 μm/min or higher and 6.0 μm/min or lower.

An oxide film removal step is preferably included in which a surface oxide film is removed from the mirror-polished wafer before heat treatment in an acid solution or acidic atmosphere. The oxide film removal step is desirably included because the removal of the natural surface oxide film is necessary not only for the cleaning of silicon wafer surface but also for the elimination of Si—P defects.

The slicing angle of substrates before mirror-polishing is desirably in a range of 0.1 degrees or more and 0.4 degrees or less against the primary plane orientation. The slicing angle of the substrates affects the growth and elimination of SF at the time of deposition of the epitaxial layer. Setting the slicing angle in the above range allows for eliminating the SF during the growth of the epitaxial layer.

Advantageous Effects of Invention

With the method according to the present invention, provision of a manufacturing method of silicon wafers is aimed by which P aggregation defects (P—Si defects) are inhibited and SF in the epitaxial layer are inhibited.

DESCRIPTION OF EMBODIMENTS

Figure 9:
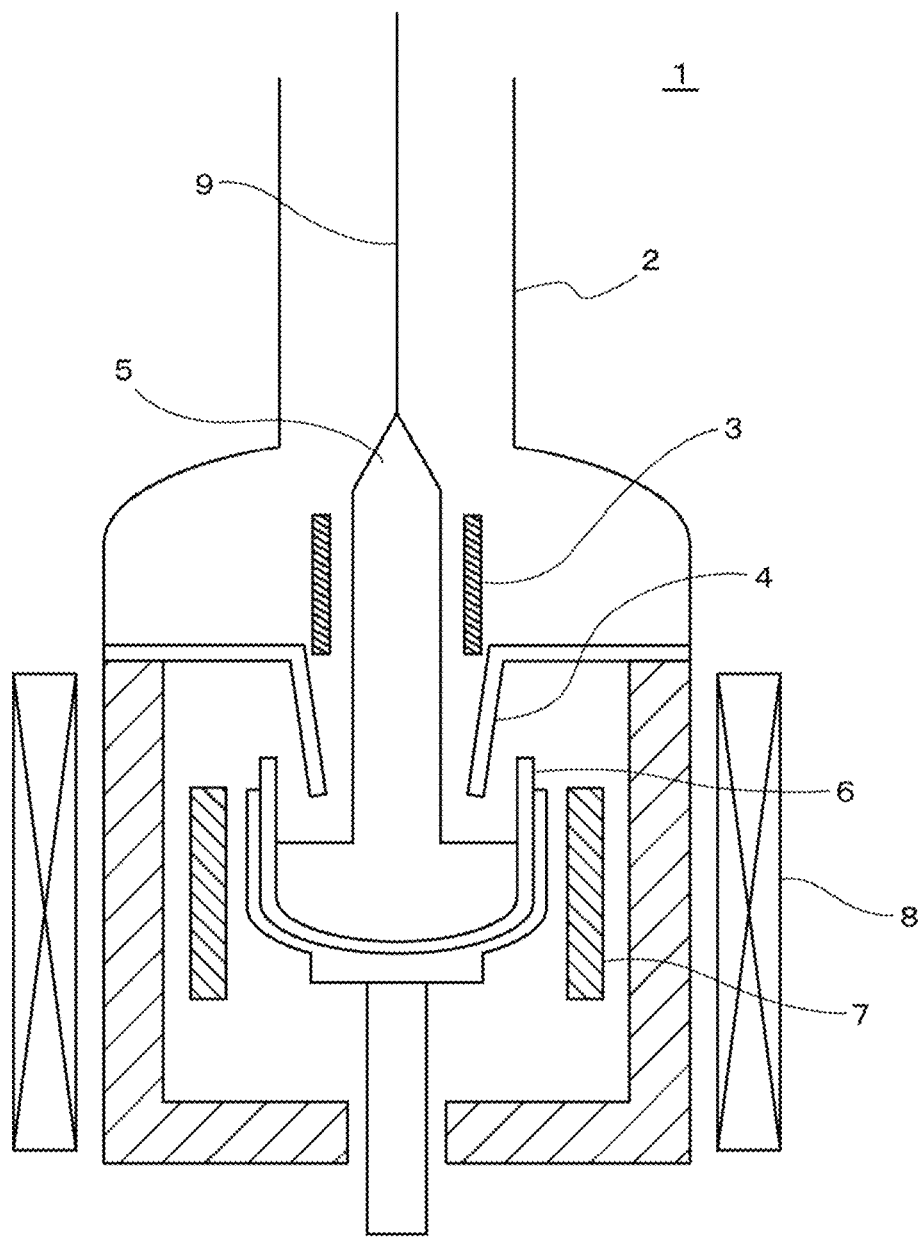
FIG. 9 is a schematic constitution diagram of a pulling-up apparatus equipped with a water cooler.

Embodiments of a manufacturing method of semiconductor silicon wafers according to the present invention will be described based on FIGS. 1, 2, and 9. The embodiment shown below is an example, and the present invention is not limited to this embodiment.

Figure 1:
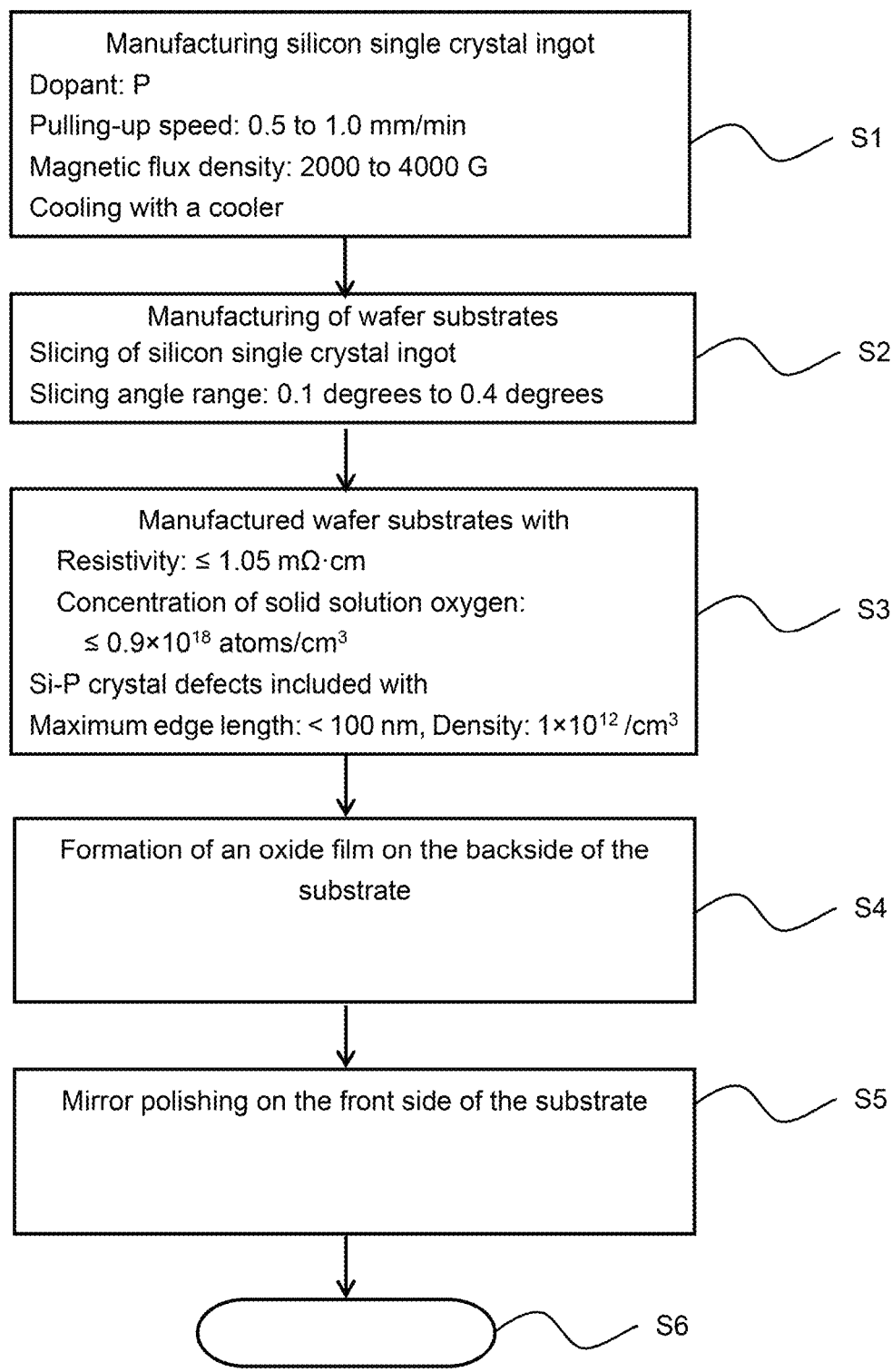
FIG. 1 illustrates a flowchart of an embodiment of a manufacturing method for silicon wafers according to the present invention.

As shown in FIG. 1, silicon single crystal ingots are manufactured by growing single crystals using the Czochralski method (Step S1). In the process of growing a single crystal, the silicon single crystal is doped with phosphorus (P) and is pulled up at a pulling-up speed of 0.5 mm/min or faster and 1.0 mm/min or lower, with applying a magnetic field of 2000 G or stronger and 4000 G or lower.

The reason why the pulling-up speed is set in the above range is as follows: to suppress the occurrence of the constitutional supercooling phenomenon in which low resistivity crystals grow in a cellular form, the ratio G/V should be large, where G is the temperature slope of the melt and V is the pulling-up speed. That is, by decreasing the pulling-up speed V, the constitutional supercooling phenomenon can be suppressed. However, when the pulling-up speed is decreased, the transit time below 700° C. (in the temperature range from 600° C. to 700° C.) becomes longer, and P aggregate defects (Si—P defects) cannot be inhibited. For this reason, the temperature slope G is increased and the constitutional supercooling phenomenon and the generation of P aggregation defects (Si—P defects) are suppressed by "forcibly cooling the crystal with the water cooler equipped in the pulling-up furnace, setting a pulling-up speed to 0.5 mm/min or faster and 1.0 mm/min or slower, and applying a magnetic field of 2000 G or stronger and 4000 G or lower."

Specifically, it is not desirable because P aggregation defects (Si—P defects) cannot be inhibited with a pulling-up speed of less than 0.5 mm/min, and the constitutional supercooling phenomenon cannot be suppressed with a pulling-up speed exceeding 1.0 mm/min.

Figure 4:
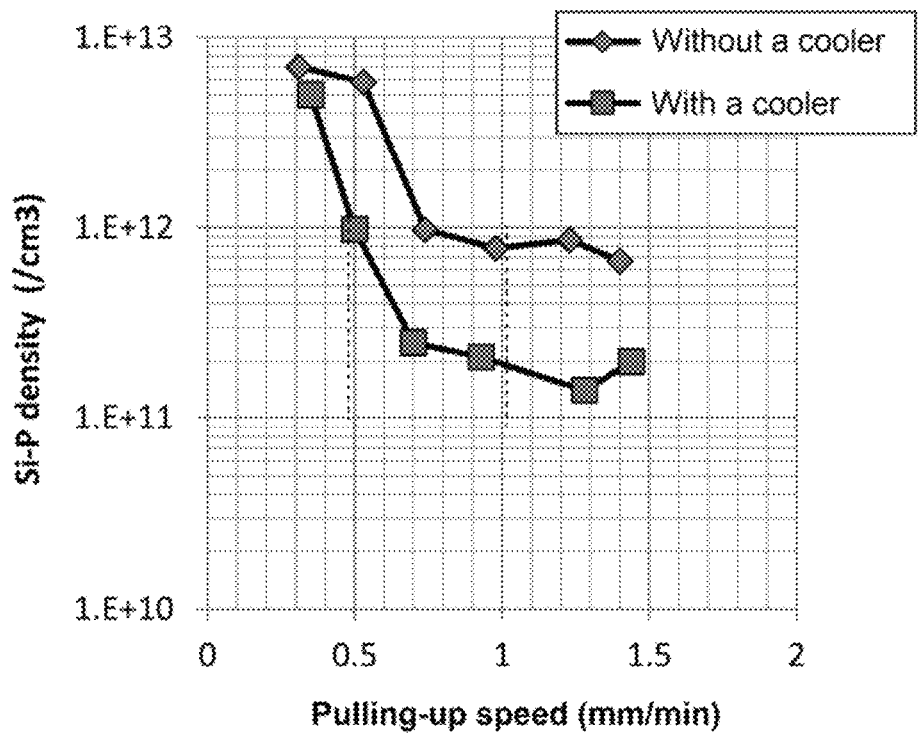
FIG. 4 is a graph illustrating the relation between Si—P defects and pulling-up speed.

The grown crystal is forcibly cooled by the water cooler equipped in the pulling-up furnace. As shown in FIG. 9, for example, silicon single crystal 5 grown is forcibly cooled using the water cooler disposed in the space between the upper area of the pulling-up furnace 2 and radiation shield 4 in the pulling-up apparatus 1, and this allows the dwelling time in a temperature range of 600° C. or higher to 700° C. or lower to be shortened. In FIG. 9, reference numeral 6 is a quartz glass crucible, reference numeral 7 is a heater, reference numeral 8 is a magnetic field application unit, and reference numeral 9 is a wire for pulling up a silicon single crystal 5. Thus, the grown silicon single crystal is forcibly cooled with the water cooler to a temperature of less than 600° C. P aggregation defects (Si—P defects) are inhibited by shortening the experience time of the wafers in a temperature range from 600° C. to 700° C., as shown in FIG. 4.

Substrates are prepared by slicing a silicon single crystal at a slicing angle in a range of 0.1 degrees to 0.4 degrees against the primary plane orientation (Step S2). The slicing angle of the substrates affects the growth and elimination of SF at the time of deposition of the epitaxial layer. The primary plane orientation is Si (100) and the slicing angle ranges from 0.1 degrees to 0.4 degrees. A silicon step terrace that would be a path for the movement of silicon atoms during epitaxial layer formation for the elimination of SF defects is formed by setting the slicing angle to be in a range of 0.1 degrees to 0.4 degrees. Due to the formation of the silicon step width, silicon atoms can move along the step width. The movement allows the removal of the strains of the silicon atoms and the elimination of the SF.

Thus manufactured substrates have a resistivity of 1.05 mΩ·cm or lower and the dissolved oxygen concentration of $0.9 \times 10^{18}$ atoms/cm$^3$ or less and contain Si—P defects that are substantially defects formed by aggregation of phosphorus in the crystal (Step S3).

Substrates demanded in the technical field have a resistivity of 1.05 mΩ·cm or lower, a dissolved oxygen concentration of $0.9 \times 10^{18}$ atoms/cm$^3$ or less. Si—P crystal defects are inhibited by the above-described method of substrates (Steps S1 and S2), but Si—P crystal defects still remain; the substrates contain Si—P crystal defects. The above values of the resistivity and the dissolved oxygen concentration can be achieved by adjusting the dopant concentration, pulling-up speed, and magnetic field intensity. The dopant concentration, pulling-up speed, and magnetic field intensity may be varied to obtain the predetermined resistivity and predetermined dissolved oxygen concentration.

The Si—P defects of thus prepared substrates desirably have less than 100 nm in maximum side length and the concentration of the defects less than $1 \times 10^{12}$/cm$^3$ or more. When the maximum side length of the Si—P defects is 100 nm or more, Si—P defects reveal as SF (LPD) after the formation of the epitaxial layer. When the density of the Si—P defects is $1 \times 10^{12}$/cm$^3$ or more, SF (LPD) also remains. Therefore, it is desirable that the maximum side length of the Si—P defects is less than 100 nm and the density of the Si—P defects is less than $1 \times 10^{12}$/cm$^3$, and the crystal growth so adjusted is desirably performed.

Next, a silicon oxide film is formed on the back surface of the substrate (Step S4). For power MOSFET devices, a silicon oxide film is generally formed on the back surface of the wafer by low-temperature CVD at a temperature less than 500° C., for example. The oxide film on the back surface is to prevent auto-doping when the epitaxial layer is grown. The oxide film is typically formed to a thickness of 300 nm to 800 nm at a reduced pressure atmosphere at a temperature range of 400° C. to 500° C.

Subsequently, the front surface of the substrate is mirror-polished (Step S5). The mirror polishing is generally performed with a polishing pad mechanically and with slurry chemically. Si—P defects are not directly reduced by mirror polishing. Si—P defects are not directly decreased by mirror polishing. By further reducing the surface roughness by mirror polishing, it is possible to make Si—P defects easily eliminated by the subsequent heat treatment.

Figure 2:
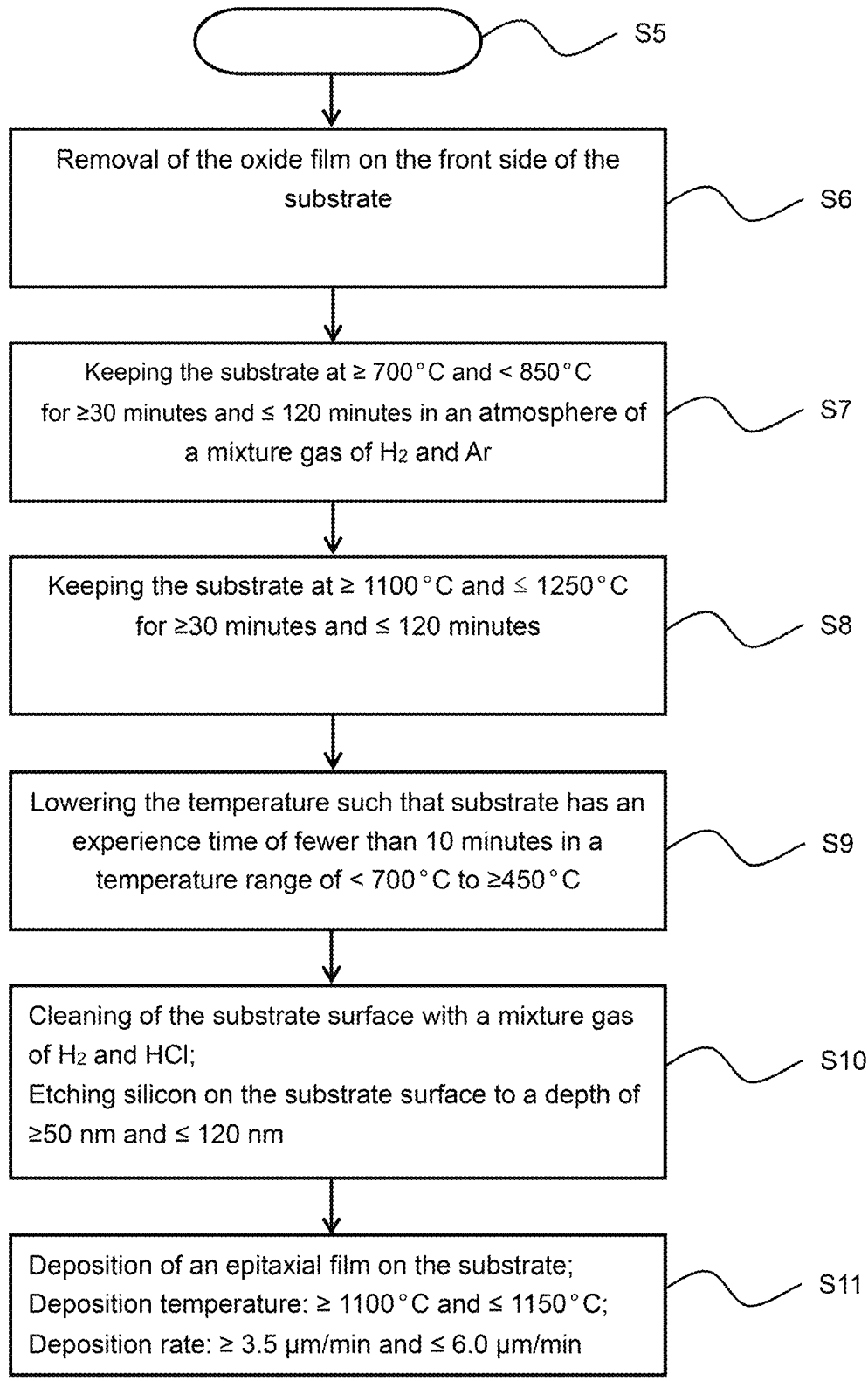
FIG. 2 illustrates a continuation of the flowchart in FIG. 1 of an embodiment of a manufacturing method for silicon wafers according to the present invention.

Next, as shown in FIG. 2, the surface oxide film of the substrate whose front surface is mirror polished is removed with an acid solution or an acid atmosphere (Step S6). The step of removing the oxide film is desirably included because it is necessary to remove the surface natural oxide film not only for the cleaning of the Si surface but also for the elimination of the Si—P defects. As for the case of removing with a chemical solution, for example, the chemical solution to be used is hydrogen fluoride HF, HF concentration diluted with pure water is 0.1% to 0.5%, and the processing time is preferably 30 to 120 seconds.

Then, as shown in FIG. 2, the substrate is heat-treated at a constant temperature of 700° C. or higher and less than 850° C. kept for 30 minutes or longer or 120 minutes or shorter (Step S7).

The silicon oxide film densifies at a temperature of around 700° C. or higher, which causes impurities, moisture, and oxygen to desorb from the silicon oxide film. The surface of the silicon substrate is apt to react at a temperature of 850° C. or higher, and when the desorption described above occurs at a temperature of 850° C. or higher, the surface roughness of the silicon wafer substrate increases. At a temperature of 700° C. or higher to 850° C. or lower, decomposition and diffusion of aggregated phosphorus in Si—P defects are promoted, but the increase in Si—P defects and density does not occur since the temperature range is low.

By setting the temperature of the desorption reaction to a temperature range, that is, a constant temperature of 700° C. or higher and less than 850° C., impurities, moisture, and oxygen can be out-diffused from the silicon oxide film, and further, an increase in surface roughness of the wafers can be prevented.

Further, the keeping time at the above temperature range is 30 minutes or longer to 120 minutes or shorter. It is not preferable because the out-diffusion is not accelerated when the keeping time is less than 30 minutes, and the productivity decreases when exceeding 120 minutes.

Further, the furnace atmosphere of the heat treatment is a mixed gas of hydrogen and argon. The reason why a diluted argon gas with hydrogen with a partial pressure of 50% to 80% is used is to accelerate the densification of the silicon oxide film by hydrogen and to prevent physical etching of the silicon oxide film by hydrogen.

Next, after the temperature is raised, the substrates are kept at a constant temperature of 1100° C. or higher to 1250° C. or lower for 30 minutes or longer to 120 minutes or shorter (Step S8). The atmosphere of the heat treatment is also the mixed gas of hydrogen and argon, similar to Step 7.

Thus, by keeping the substrates at a constant temperature of 1100° C. or higher to 1250° C. or lower for 30 minutes or longer to 120 minutes or shorter, strains due to Si—P defects can be eliminated, and therefore SF defects in the epitaxial layer are also inhibited.

It is not preferable because Si—P defects cannot be relaxed when kept at a temperature less than 1100° C. or for less than 30 minutes at the above temperature range, and substrates deform when kept at a temperature higher than 1250° C. or for 120 minutes or longer at the above temperature range.

Further, subsequently, the temperature of the wafers is lowered so that the experience time of the wafers experiencing temperatures from less than 700° C. to 450° C. or higher is less than 10 minutes (Step S9).

Thus, P aggregation defects, or Si—P defects, can be inhibited by reducing the passing time of the temperature range of less than 700° C. to 450° C. or higher.

As for the furnace atmosphere, composed of a mixed gas of hydrogen and argon, of the heat treatment, the partial pressure of hydrogen in the diluted argon gas is preferably set to 80% to 50% when the temperature is in a range from 700° C. or higher to less than 850° C. and the partial pressure of hydrogen in the diluted argon gas is preferably set to 0.01% to 20% when the temperature is less than 700° C. or 850° C. or higher.

The reason why the partial pressure of hydrogen of the diluted argon gas is set to 80% to 50% at the temperature of 700° C. or higher to less than 850° C. is to accelerate the densification of the silicon oxide film by hydrogen and to suppress physical etching of the silicon oxide film by hydrogen. Thereafter, the reason why the partial pressure of hydrogen of the diluted argon gas is set to 0.01% to 20% for a temperature of 850° C. or higher is to accelerate the densification of the silicon oxide film by hydrogen and to suppress the physical etching of the silicon oxide film by hydrogen.

A surface cleaning treatment is performed on the substrates before the process of epitaxial layer formation (Step S10). In the surface cleaning treatment, the surface of the Si substrate is removed by etching using a mixed gas of hydrogen ($H_2$), hydrogen chloride (HCl), and Si—H—Cl by 50 nm or more to 150 nm or less. This cleaning treatment allows removing strains of Si—P defects physically and further reducing SF after the epitaxial layer formation. Defect removal using hydrogen chloride (HCl) is effective and defect removal using a mixed gas of hydrogen ($H_2$) and hydrogen chloride (HCl) is desirable.

The depth of the residual defects is approximately not more than 100 nm, and therefore the removal depth of the surface of silicon by etching roughly in a range of 50 nm and 150 nm is suitable if the productivity is taken into account.

The surface cleaning treatment is performed in a mixed gas of hydrogen ($H_2$), hydrogen chloride (HCl), and Si—H—Cl. In the beginning, the partial pressure of hydrogen chloride (HCl) is set to a certain value in a mixed gas of hydrogen and hydrogen chloride. Then reconstruction of the surface shape in hydrogen baking is performed after reducing the partial pressure of hydrogen chloride, and after that, while varying the partial pressure of hydrogen chloride, Si—H—Cl gas may be introduced.

Next, a silicon monocrystalline epitaxial layer is deposited with a thickness of 1.3 µm or thicker to 10.0 µm or less. Silicon deposition is carried out at a temperature of 1100° C. or higher and 1150° C. or lower and at a deposition rate of 3.5 µm/min or faster and 6.0 µm/min or slower (Step S11).

It is found that there exist appropriate combinations of growth speed and temperature for silicon monocrystalline epitaxial layer growth.

Figure 3:
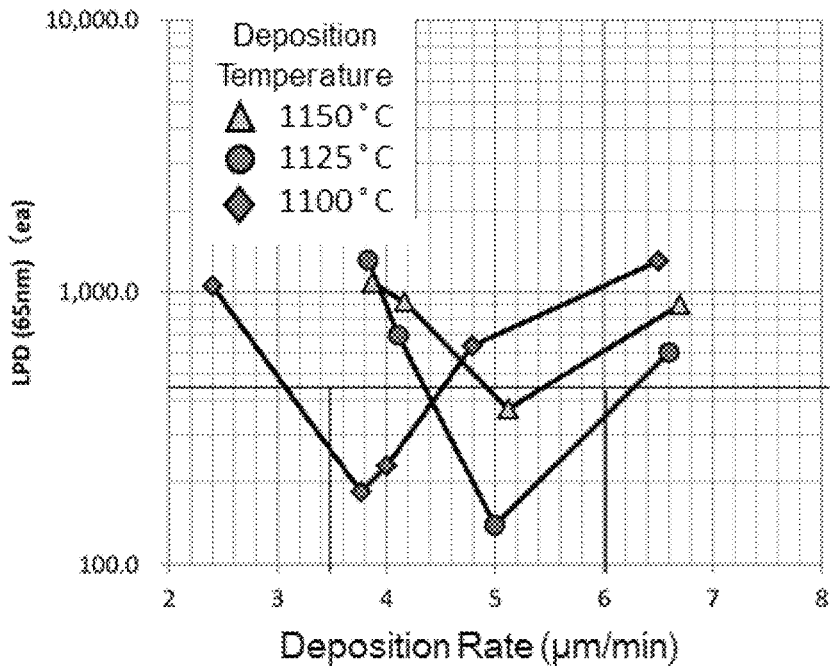
FIG. 3 is a graph illustrating the dependence of LPD on silicon deposition temperature and the growth rate.

As shown in FIG. 3, it is found that light point defects (LPD) are suppressed by setting the silicon deposition temperature to 1100° C. or higher and 1150° C. or lower and the deposition rate to 3.5 µm/min or faster and 6.0 µm/min or slower.

The reason why the epitaxial layer is deposited in a range of thickness of 1.3 µm or thicker to 10.0 µm or thinner is that the silicon monocrystalline epitaxial layer with a thickness less than 1.3 µm cannot withstand a breakdown voltage during the device operation, and the thickness of the epitaxial layer of more than 10 µm may cause a cost increase of epitaxial wafers.

A silicon layer is grown through the movement of silicon atoms on the steps on the silicon surface. With this process, the formation of SF is inhibited because the movement of silicon atoms corrects disorders of the arrangement of silicon atoms originating from Si—P defects.

To achieve both Si layer deposition and this correction, a condition that the Si layer deposition temperature is 1100° C. or higher and 1150° C. or lower, and the deposition rate is 3.5 µm/min or higher and 6.0 µm/min or lower is required.

EMBODIMENTS

The present invention will be further specifically described based on examples and comparative examples, but the present invention is not limited to the examples.

Experiment 1

The dependence of the size and density of Si—P defects generated in the substrates on the variation of the pulling-up speed of silicon single crystals, the variation of the strength of the magnetic field, and the existence of forced cooling by the water cooler was verified. Silicon single crystals doped with phosphorus (P) were pulled up so that resistivity was adjusted to be 1.05 mΩ·cm or less and the concentration of solid-solution oxygen is $0.9 \times 10^{18}$ atoms/cm$^3$ or less.

In the process of single crystal growth, the pulling-up speed was varied from 0.3 mm/min to 1.4 mm/min, and the applied magnetic field was 3000 G then. Further, the maximum side length of Si—P defects and the density of the Si—P defects were investigated in the cases the water cooler in the pulling-up furnace is installed or not.

The results are shown in FIG. 4. The size of the Si—P defects was measured with a transmission electron microscope. The density of the Si—P defects was calculated from the observed area with the transmission electron microscope. As a result, the maximum side lengths of the Si—P defects are less than 100 nm for both cases with or without the installation of the water cooler.

For the case without the water cooler, density tends to reduce by increasing the pulling-up speed; that is, the density is $1 \times 10^{12}$/cm$^3$ or less at the pulling-up speed of approximately 0.7 mm/min or more. The reduction rate from the above value, however, is very low. In contrast, for the case with the installation of the water cooler, the density becomes $1 \times 10^{12}$/cm$^3$ or less by setting the pulling-up speed to be approximately 0.5 mm/min or more. Even though the pulling-up speed is set to be more than 1 mm/min, the density tends to decrease with the increase of the pulling-up speed. However, since its effectiveness is small and the productivity lowers, the pulling-up speed is preferably 1 mm/min or less.

Experiment 2

The relation between the number of LPDs and the removal amount of silicon on the surface of the substrates is verified. The verification method is the measurement of the number of LPDs using Surfscan SP1 manufactured by KLA-Tencor Corporation.

Experiment 2 is an experiment, performed in Step 10 in FIG. 2, to confirm the inhibition effect of SF (LPD) when the amount of removal of the silicon surface layer by HCl is varied before the deposition of an epitaxial layer.

Firstly, a silicon oxide film was formed on the backside of a substrate; the substrate has a resistivity of 1.05 mΩ·cm or less, a concentration of solid-solution oxygen of $0.9 \times 10^{18}$ atoms/cm$^3$ or less, and Si—P defects having the maximum side length less than 100 nm and the density of the defects less than $1 \times 10^{12}$/cm$^3$. The oxide film was formed to a thickness of 500 nm at a temperature in a range of 400° C. to 450° C.

Next, the front surface of the substrate was mirror-polished. The removal amount of the mirror-polishing was 15 μm. The surface-mirror-polished substrate was heat-treated in a vertical diffusion furnace at 800° C. for 120 minutes and at 1200° C. for 60 minutes. The atmosphere of the furnace of the heat treatment was a mixture gas of hydrogen (H$_2$) and argon (Ar) (diluted Ar gas with a partial pressure of hydrogen of 60%). The experience time for the substrate for experiencing temperatures from 700° C. to 450° C. was 8 minutes.

Figure 5:
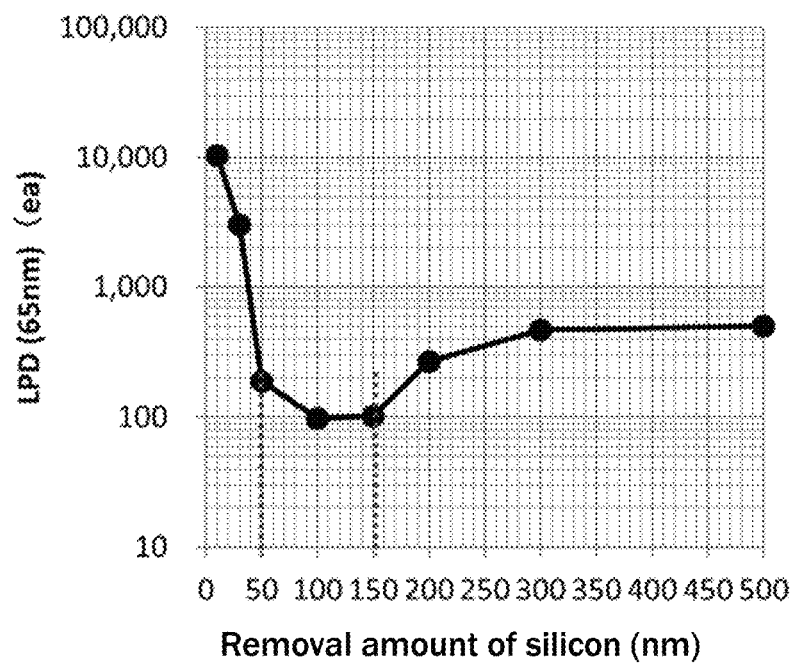
FIG. 5 is a graph illustrating the relation between the number of LPD and the amount of removed silicon.

A silicon monocrystalline epitaxial layer was deposited to a thickness of 4.0 μm on the substrate at a deposition rate of 4.0 μm/min at 1150° C. The removal amount of the Si surface layer with HCl before the deposition was varied up to 500 nm at maximum. The partial pressure of HCl was 0.5% then. The number of LPDs (65 nm) on the substrate was measured, and the results are shown in FIG. 5. "ea" of the vertical axis in FIG. 5 represents the number of LPDs. The term LPD (65 nm) means the measurement of LPDs existing on the principal surface having a scattering intensity equivalent to that of a particle of 65 nm or larger in standard particle size.

As understood from FIG. 5, it is found that the number of LPD (65 nm) is 10,000 when the silicon removal of the substrate surface is not performed, and that, on the other hand, the number of LPD (65 nm) is 100 to 200 when the silicon removal depth of the substrate surface is 50 nm to 150 nm.

Experiment 3

In Experiment 3, as shown by Step 7 in FIG. 2, by keeping the substrates at a constant temperature of 700° C. or higher and less than 850° C. for 30 minutes or longer and 120 min or shorter, the increase of wafer surface roughness was reduced. Verification experiments on inhibition due to the reduction effect of the generated wafer surface pits (LPD) and on the promotion of elimination of Si—P defects were performed.

A silicon oxide film was formed on the backside of a substrate; the substrate has a resistivity of 1.05 mΩ·cm or less, a concentration of solid-solution oxygen of $0.9 \times 10^{18}$ atoms/cm$^3$ or less, and Si—P defects having the maximum side length less than 100 nm and the density of the defects less than $1 \times 10^{12}$/cm$^3$. The oxide film was formed to a thickness of 500 nm at a temperature ranging from 400° C. to 450° C.

Successively the front surface of the substrates was mirror-polished. The removal amount by the mirror polishing was 15 μm. The mirror-polished substrates were heat-treated at 1200° C. for 60 min in a vertical-type diffusion furnace. The furnace atmosphere for the heat treatment was a mixture gas of hydrogen and argon (diluted Ar gas with a partial pressure of hydrogen of 1%).

At the time of raising the temperature for the heat treatment at 1200° C. for 60 min, the substrates were kept at temperatures of 650° C., 700° C., 800° C., 850° C., and 900° C., at each temperature for 15 minutes, 30 minutes, 120 minutes, and 180 minutes. The furnace atmosphere for the heat treatment was a mixture gas of hydrogen and argon (diluted Ar gas with a partial pressure of hydrogen of 60%).

The experience time for the wafer substrate for experiencing temperatures from 700° C. to 450° C. was 8 minutes. A silicon monocrystalline epitaxial layer was formed to a thickness of 4 μm on the wafer substrate at a deposition rate of 4.0 μm/min at 1150° C. The removal amount with hydrogen chloride before the deposition was 100 nm, and the partial pressure of hydrogen chloride was 0.5%.

Figure 6:
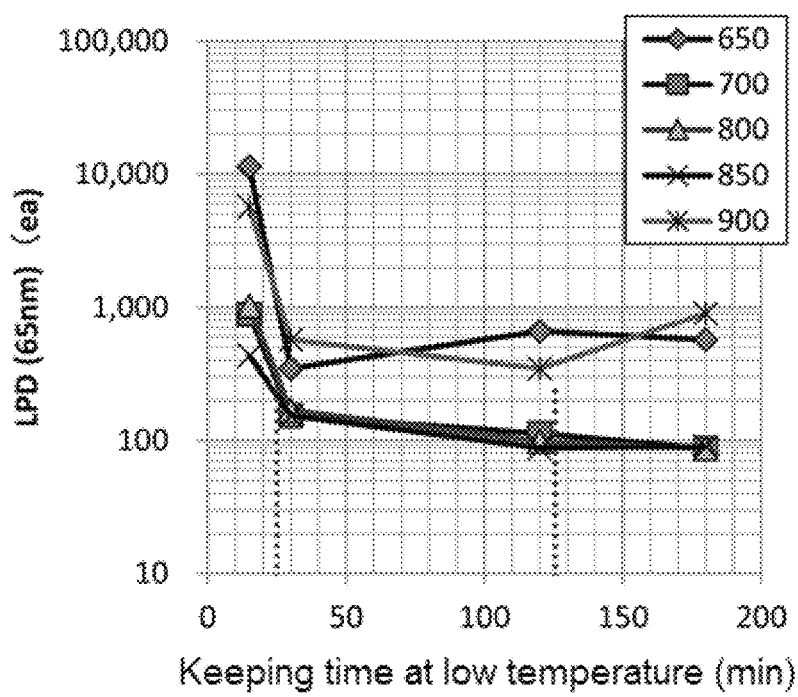
FIG. 6 is a graph illustrating the relation between the number of LPD and the holding time at a temperature of 650° C. to 900° C.

The verification method is the measurement of the number of LPDs using Surfscan SP1 manufactured by KLA-Tencor Corporation. The results are shown in FIG. 6. As seen from FIG. 6, it is found that the number of LPD reaches a substantially constant value in 30 minutes. It is confirmed that keeping time is preferably 30 minutes to 120 minutes if the productivity is taken into account.

The degradation in the number of LPDs when kept at 650° C. or 900° C. is attributed to it that keeping the substrates at the temperature causes impurities, moisture, and oxygen to desorb from the silicon oxide film on the backside of the wafer and to increase the surface roughness of the wafer, and the pits generated thereby to remain as LPDs after the epitaxial growth. Therefore, the heat treatment temperature of wafers is preferably from 700° C. to 850° C.

Experiment 4

In Experiment 4, shown as Step 8 in FIG. 2, it was verified whether strains due to Si—P defects were able to be relaxed by keeping the substrates at a constant temperature from 1100° C. to 1250° C. for 30 minutes or longer and 120 minutes or shorter.

Firstly, a silicon oxide film was formed on the backside of a substrate; the substrate has a resistivity of 1.05 mΩ·cm or less, a concentration of solid-solution oxygen of $0.9 \times 10^{18}$ atoms/cm$^3$ or less, and Si—P defects having the maximum side length less than 100 nm and the density of the defects less than $1 \times 10^{12}$/cm$^3$. The oxide film was deposited to a thickness of 500 nm at a temperature in the range of 400° C. to 450° C. Successively, the front surface of the substrate was mirror-polished, and the removed amount by mirror-polishing was 15 μm.

The substrate whose front surface was mirror-polished was heat-treated in a vertical-type furnace at 1050° C., 1100° C., 1200° C., 1250° C., and 1270° C., at each temperature for 15 minutes, 30 minutes, 120 minutes, and 180 minutes. At the time of temperature rise before the heat treatment at 1050° C., 1100° C., 1200° C., 1250° C., and 1270° C., the substrate was heat-treated by keeping it at 800° C. for 120 minutes.

The furnace atmosphere for the heat treatment was a mixture gas of hydrogen and argon (diluted Ar gas with a partial pressure of hydrogen of 1%). At the time of lowering the temperature, the experience time for the wafer substrate for experiencing temperatures from 700° C. to 450° C. was 8 minutes.

The removal amount with hydrogen chloride before the deposition of silicon monocrystalline epitaxial layer was 100 nm, and the partial pressure of hydrogen chloride was 0.5% and the temperature was 1180° C. then. After that, a silicon monocrystalline epitaxial layer was formed to a thickness of 4 μm on the substrate at a deposition rate of 4.0 μm/min at 1150° C.

Figure 7:
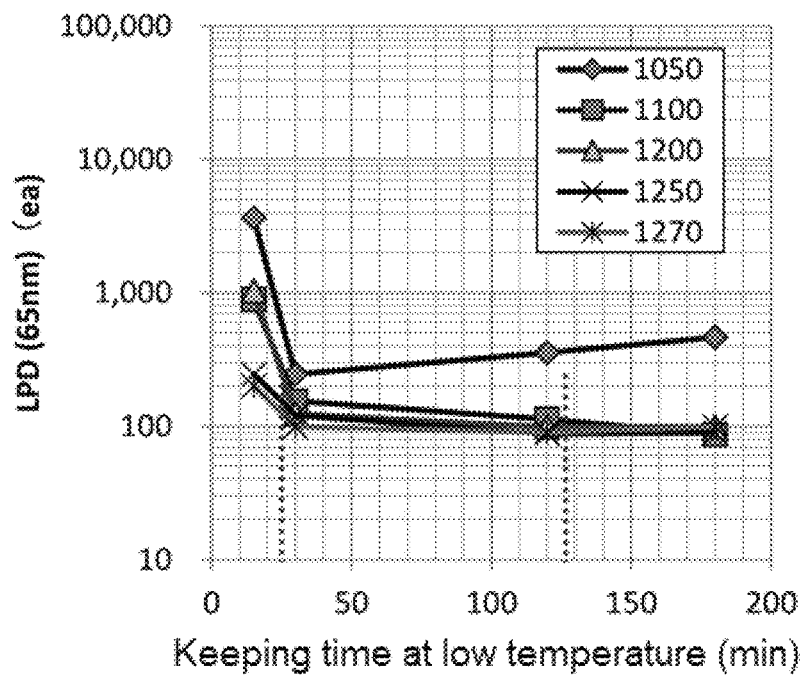
FIG. 7 is a graph illustrating the relation between the number of LPD and the holding time in heat treatments at the temperature of 1050° C. to 1270° C.

The verification method is the measurement of the number of LPDs using Surfscan SP1 manufactured by KLA-Tencor Corporation. The results are shown in FIG. 7. As seen from FIG. 7, it is found that the number of LPDs reaches a substantially constant value in 30 minutes. It is confirmed that keeping time is preferably 30 minutes to 120 minutes if the productivity is taken into account. As shown in FIG. 7, the number of LPDs decreases as the temperature rises. The temperature is preferably from 1100° C. to 1250° C. considering the problems of slip and productivity.

Experiment 5

In Experiment 5, shown as Step 9 in FIG. 2, it was verified whether the phosphorus(P)-re-aggregation defects (Si—P defects) were able to be inhibited by reducing the passing time to 10 minutes of a temperature range of less than 700° C. to 450° C. or higher.

Firstly, a silicon oxide film was formed on the backside of a substrate; the substrate has a resistivity of 1.05 mΩ·cm or less, a concentration of solid-solution oxygen of $0.9 \times 10^{18}$ atoms/cm$^3$ or less, and Si—P defects having a maximum side length of less than 100 nm and the density of the defects less than $1 \times 10^{12}$/cm$^3$. The oxide film was deposited to 500 nm in a temperature range of 400° C. to 450° C. Successively, the front surface of the substrate was mirror-polished, and the removal amount by the mirror-polishing was 15 μm.

Subsequently, the substrate mirror-polished on the front surface was heat-treated at 1200° C. for 60 min. The atmosphere of the furnace of the heat treatment was a mixture gas of hydrogen (H$_2$) and argon (Ar) (diluted Ar gas with a partial pressure of hydrogen of 1%). At the time of the temperature rise before the heat treatment at 1200° C. for 60 minutes, the substrate was heat-treated at 800° C. for 120 minutes. A this time, the atmosphere of the furnace of the heat treatment was a mixture gas of hydrogen (H$_2$) and argon (Ar) (diluted Ar gas with a partial pressure of hydrogen of 60%).

The take-ot temperature after the above-described heat treatment was set to 700° C. and the take-ot speed from the furnace was varied from this point of time. The temperature of the silicon wafers exposed to the ambient atmosphere was measured using thermography, and the experience time was calculated by adding the take-out time to the keeping time at 700° C. With this, the experience time for the wafers experiencing temperatures less than 700° C. to 450° C. or higher was varied as 3 minutes, 5 minutes, 8 minutes, 10 minutes, 12 minutes, 15 minutes, and 20 minutes.

The surface layer of the silicon substrates was removed 100 nm by hydrogen chloride before the deposition of a silicon monocrystalline epitaxial layer. At this time, the partial pressure of hydrogen chloride was 0.5%, and the temperature was 1180° C. Then a silicon monocrystalline epitaxial layer was formed to a thickness of 4 μm on the substrate at 1150° C. The results are shown in FIG. 8.

Figure 8:
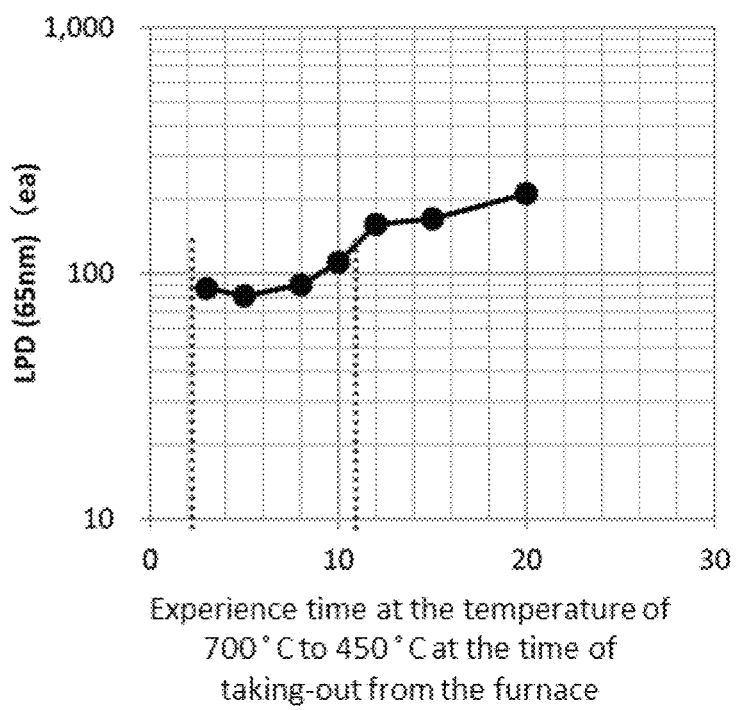
FIG. 8 is a graph illustrating the relation between the number of LPD and the experience time at 700° C. to 450° C. at the time of extraction.

As shown in FIG. 8, it is confirmed that, by lowering the temperature such that the experience time for the wafer experiencing temperatures less than 700° C. and 450° C. or higher is less than 10 minutes, the number of LPDs becomes a hundred (100) or less and the phosphorus re-aggregation defects (Si—P defect) are inhibited.

Experiment 6

Experiment 6 was performed to verify that phosphorus-aggregation defects (Si—P defects) were able to be inhibited by depositing an epitaxial layer to a thickness of 1.3 μm or thicker and 10.0 μm or thinner, as shown as Step 11 in FIG. 2, after depositing a silicon layer at a deposition rate of 3.5 μm/min or higher and 6 μm/min or lower at a temperature of 1100° C. or higher and 1150° C. or lower.

Firstly, a silicon oxide film was formed on the backside of a substrate; the substrate has a resistivity of 1.05 mΩ·cm or less, a concentration of solid-solution oxygen of $0.9 \times 10^{18}$ atoms/cm$^3$ or less, and Si—P defects having a maximum side length less than 100 nm and the density of the defects less than $1 \times 10^{12}$/cm$^3$. The oxide film was deposited to a thickness of 500 nm at a temperature in the range of 400° C. to 450° C.

Subsequently, the front surface of the substrate was mirror-polished, and the removal amount due to the mirror-polishing was 15 μm. The mirror-polished substrates were heat-treated at 1200° C. for 60 minutes in a vertical-type diffusion furnace. In this procedure, the atmosphere of the furnace of the heat treatment was a mixture gas of hydrogen (H$_2$) and argon (Ar) (diluted Ar gas with a partial pressure of hydrogen of 1%).

At the time of raising the temperature before the heat treatment at 1200° C. for 60 minutes, the substrate was heat-treated at 800° C. for 120 minutes. At this time, the atmosphere of the furnace of the heat treatment was a mixture gas of hydrogen (H$_2$) and argon (Ar) (diluted Ar gas with a partial pressure of hydrogen of 60%). At the time of lowering the temperature, the experience time for the substrate for experiencing temperatures from 700° C. to 450° C. was 8 minutes.

The surface of the silicon substrates was removed by 100 nm by hydrogen chloride before the epitaxial growth procedure with a partial pressure of hydrogen chloride of 0.5% at a temperature of 1180° C. Then silicon epitaxial layers were deposited on the substrates at temperatures of 1100° C., 1125° C., and 1150° C. with varying the growth rates at each temperature of 2.4 μm/min, 3.8 μm/min, 4 μm/min, 5 μm/min, and 6.4 μm/min. The thicknesses of the silicon epitaxial layers were 4 μm. Then the number of LPDs was measured with Surfscan SP1 manufactured by KLA-Tencor Corporation. The results are shown in FIG. 3.

As shown in FIG. 3, it is found that LPD is inhibited by setting the temperature of silicon layer deposition to 1100° C. or higher and 1150° C. or lower and the growth rate to 3.5 μm/min or more and 6 μm/min or less. The deposition temperature of silicon epitaxial layer is desirably 1100° C. or higher and 1150° C. or lower because problems such as slip dislocation on the substrates reveal when the temperature of silicon epitaxial layer deposition is 1200° C.

What is claimed is:

1. A method for manufacturing a semiconductor silicon wafer composed of a silicon wafer substrate and a silicon monocrystalline epitaxial layer thereon,
where the silicon wafer substrate is sliced from a monocrystalline silicon ingot doped with phosphorus which is grown by the Czochralski method at a pulling speed of 0.5 mm/min or more and 1.0 mm/min or less with the application of a magnetic field of 2000 G or more and 4000 G or less, and the silicon wafer substrate has a resistivity of 1.05 mΩ·cm or less, a concentration of solid-solution oxygen of $0.9 \times 10^{18}$ atoms/cm$^3$, and Si—P defects that are substantially P aggregation defects generated by forcibly cooling the grown crystal with a water-cooler which is installed within the pulling-up furnace, the method comprising:

a step of mirror-polishing a front surface of the silicon wafer substrate;

a step of heat treatment of the silicon wafer substrate after mirror-polishing, in the heat treatment step, the substrate being kept at a constant temperature between 700° C. or higher and 850° C. or lower for 30 minutes or longer to 120 minutes or shorter, then after rising the temperature the silicon wafer substrate being kept at a temperature between 1100° C. or higher and 1250° C. or lower for 30 minutes or longer to 120 minutes or shorter, and then after, an experience time for the silicon wafer substrate to experience temperatures between 700° C. and 450° C. at a time of temperature cooling being less than 10 minutes, wherein in the series of the heat treatment, a furnace atmosphere is a mixed gas composed of hydrogen H2 and argon Ar; and after the heat treatment step, a step of depositing a silicon monocrystalline epitaxial layer to a thickness equal to 1.3 μm or more and 10.0 μm or less.

2. The method for manufacturing a semiconductor silicon wafer according to claim 1, wherein a maximum side length of Si—P defects in the silicon wafer substrate is less than 100 nm and the density of the defects is less than $1 \times 10^{12}$/cm$^3$.

3. The method for manufacturing a semiconductor silicon wafer according to claim 1, wherein the furnace atmosphere in the heat treatment step is diluted argon gas with hydrogen (H$_2$) having a partial pressure ranging from 50% to 80% at the time of raising the temperature from 700° C. or higher to less than 850° C. and diluted argon gas with hydrogen (H$_2$) having a partial pressure ranging from 0.01% to 20% at a temperature of 850° C. or higher.

4. The method for manufacturing a semiconductor silicon wafer according to claim 1, further comprising a step of surface cleaning of the silicon wafer substrate before the step of deposition of an epitaxial layer thereon, in the surface cleaning step, silicon on the substrate surface to be etched to a depth of 50 nm or more to 150 nm or less with a mixture gas of hydrogen (H$_2$), hydrogen chloride (HCl), and Si—H—Cl.

5. The method for manufacturing a semiconductor silicon wafer according to claim 1, wherein in the step of deposition of a silicon monocrystalline epitaxial layer, the epitaxial layer is deposited at a deposition temperature of 1100° C. or higher and 1150° C. or lower at a deposition rate of 3.5 μm/min or higher and 6.0 μm/min or lower.

6. The method for manufacturing a semiconductor silicon wafer according to claim 1, further comprising a step of oxide-film removal, from the mirror-polished wafer substrate before heat treatment in which the surface oxide film thereof is removed with an acid solution or an acid atmosphere.

7. The method for manufacturing a semiconductor silicon wafer according to claim 1, wherein a slicing angle of the silicon wafer substrate before mirror-polishing against the primary plane orientation ranges from 0.1 degrees or larger to 0.4 degrees or smaller.

* * * * *